United States Patent [19]

Sudo et al.

[11] Patent Number: 5,640,035

[45] Date of Patent: Jun. 17, 1997

[54] MOSFET HAVING IMPROVED DRIVING PERFORMANCE

[75] Inventors: Akira Sudo; Toshiharu Watanabe, both of Yokohama, Japan

[73] Assignee: Kabushiki Kaisha Toshiba, Kawasaki, Japan

[21] Appl. No.: 555,550

[22] Filed: Nov. 9, 1995

Related U.S. Application Data

[63] Continuation of Ser. No. 348,950, Nov. 25, 1994, abandoned, which is a continuation of Ser. No. 45,732, Apr. 14, 1993, abandoned.

[30] Foreign Application Priority Data

Apr. 14, 1992 [JP] Japan ..................... 4-094264

[51] Int. Cl.$^6$ ................. H01L 29/76; H01L 29/94; H01L 31/062; H01L 31/113
[52] U.S. Cl. ................. 257/344; 257/336; 257/340; 257/408; 257/413; 257/384
[58] Field of Search ................. 257/344, 336, 257/340, 408, 410, 413, 384

[56] References Cited

U.S. PATENT DOCUMENTS

| 4,906,589 | 3/1990 | Chao | 257/408 |
| 5,041,885 | 8/1991 | Gualandris et al. | 257/344 |

FOREIGN PATENT DOCUMENTS

| 63-90853 | 4/1988 | Japan | 257/408 |
| 63-122174 | 5/1988 | Japan | 257/408 |
| 3-204941 | 9/1991 | Japan | 257/408 |

*Primary Examiner*—Steven H. Loke
*Attorney, Agent, or Firm*—Banner & Witcoff, Ltd.

[57] ABSTRACT

A gate oxide film is formed on the surface of a P-type silicon substrate. A gate electrode is formed on the gate oxide film. Phosphorus is ion-implanted into the P-type silicon substrate, using the gate electrode as a mask. Thus, $N^-$-type layers of LDD regions are formed in the P-type silicon substrate. Sidewall regions of material having a high dielectric constant are formed on both sides of the gate electrode. The P-type silicon substrate is etched downward adjacent to both the sidewall regions. $N^+$-type layers of source and drain regions are formed in the etched surface of the P-type silicon substrate.

9 Claims, 2 Drawing Sheets

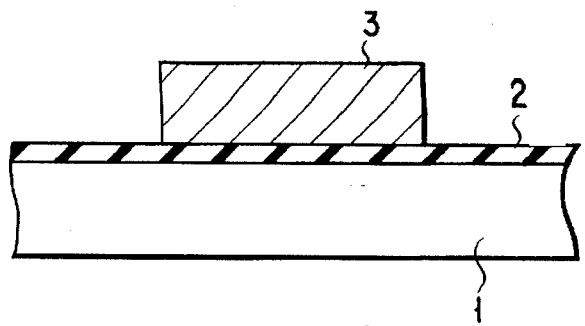
F I G. 1
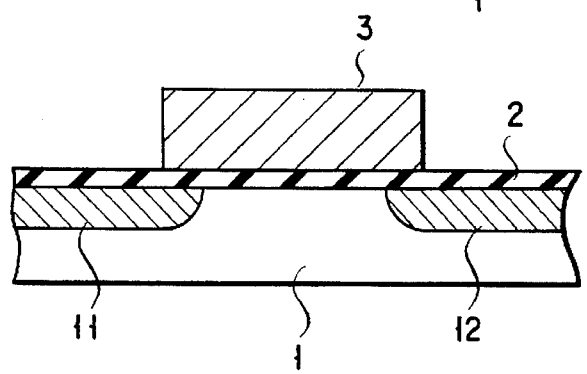
F I G. 2
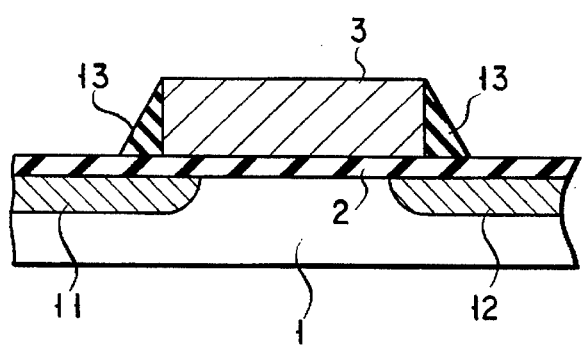
F I G. 3
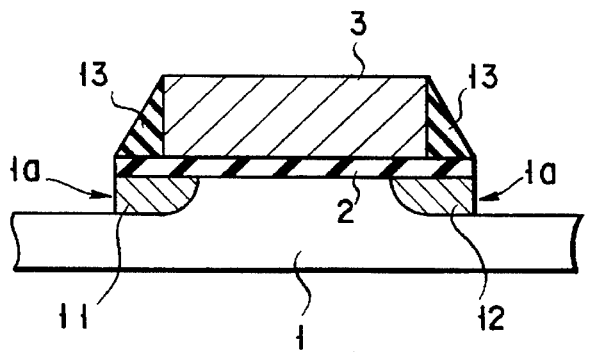
F I G. 4
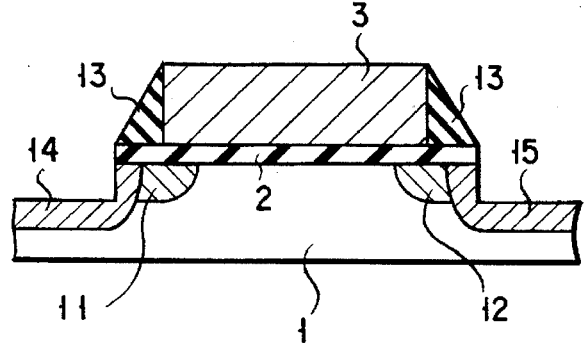
F I G. 5

MOSFET HAVING IMPROVED DRIVING PERFORMANCE

This application is a continuation of application Ser. No. 08/348,950, filed Nov. 25, 1994, now abandoned, which is a continuation of application Ser. No. 08/045,732, filed Apr. 14, 1993, now abandoned.

BACKGROUND OF THE INVENTION

1. Field of the Invention

The present invention relates to a semiconductor device and a method for manufacturing the same and, more specifically, a MOSFET and a method for manufacturing the same.

2. Description of the Related Art

First a conventional LDD (lightly doped drain) transistor will be described. A gate oxide film is formed on the surface of a P-type silicon substrate, a gate electrode is formed on the gate oxide film, and sidewalls of $SiO_2$ are formed on both sides of the gate electrode by CVD (chemical vapor deposition). Ions are implanted into an LDD region, using the gate electrode as a mask, to form an $N^-$-type layer in the P-type silicon substrate, and ions are implanted into a source/drain region, using the gate electrode and the sidewalls as masks, to form an $N^+$-type layer in the P-type silicon substrate.

In the LDD transistor, even though a high voltage is applied to the drain side, a drain electric field is mitigated by the $N^-$-type layer of the LDD region. Therefore, impact ionization is suppressed in the vicinity of the drain region, and hot carriers are reduced, resulting in high reliability of the transistor.

Since, in the LDD transistor described above, the ion concentration of the $N^-$-type layer of the LDD region is low, the parasitic resistance is higher than that of a normal transistor, with the result that the LDD transistor deteriorates in driving performance. In order to prevent the driving performance from deteriorating, an LDD transistor having sidewalls formed of materials having a high dielectric constant, such as SiN, is proposed.

In the conventional LDD transistor, the electric field of the surface of the $N^-$-type layer is strengthened by the sidewalls formed of materials having a high dielectric constant. The concentration of electrons of the $N^-$-type layer is increased, and the parasitic resistance thereof is lowered. In this case, however, a gate fringing electric field is increased, and a large gate parasitic capacitance is generated between the gate electrode and the $N^+$-type layer of the source/drain region, thereby causing a drawback wherein the driving performance of the transistor is decreased and the power consumption thereof is increased.

SUMMARY OF THE INVENTION

An object of the present invention is to provide a semiconductor device and a method for manufacturing the same which includes an LDD transistor whose sidewalls are formed of materials having a high dielectric constant to reduce the parasitic resistance of an $N^-$-type layer of an LDD region but enable the gate parasitic capacitance between a gate electrode and a source/drain region to be decreased, thereby improving the driving performance of the transistor and lowering the power consumption thereof.

The above object is attained by the following constitution.

According to one aspect of the present invention, there is provided a method for manufacturing a semiconductor device, comprising:

a first step of forming a gate electrode above a surface of a semiconductor substrate;

a second step of forming sidewall regions on both sides of the gate electrode;

a third step of downwardly etching the semiconductor substrate adjacent to both the sidewall regions; and a fourth step of forming source and drain regions in the etched surface of the semiconductor substrate.

According to another aspect of the present invention, there is provided a semiconductor device comprising:

a gate electrode formed above a surface of a semiconductor substrate;

sidewall regions formed on both sides of the gate electrode;

step portions formed in the semiconductor substrate by downwardly etching the semiconductor substrate adjacent to both the sidewall regions; and source and drain regions formed in the etched surface of the semiconductor substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a cross-sectional view showing a step in methods for manufacturing a semiconductor device according to first to third embodiments of the present invention;

FIG. 2 is a cross-sectional view showing a step subsequent to the step shown in FIG. 1 in the manufacturing methods according to first to third embodiments of the present invention;

FIG. 3 is a cross-sectional view showing a step subsequent to the step shown in FIG. 2 in the manufacturing methods according to first to third embodiments of the present invention;

FIG. 4 is a cross-sectional view showing a step subsequent to the step shown in FIG. 3 in the manufacturing methods according to the first and third embodiments of the present invention;

FIG. 5 is a cross-sectional view showing a step subsequent to the step shown in FIG. 4 in the manufacturing method according to the first embodiment of the present invention;

DETAILED DESCRIPTION OF THE PREFERRED EMBODIMENTS

Figure 6:
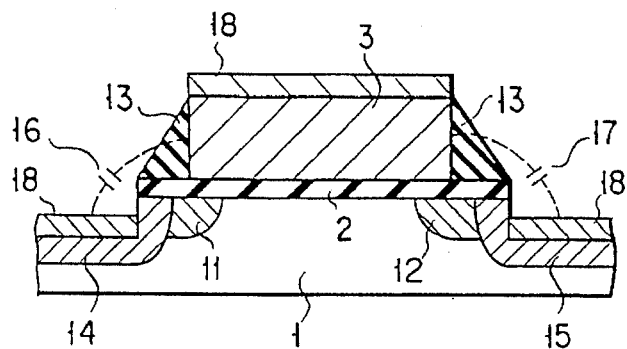
FIG. 6 is a cross-sectional view showing a step subsequent to the steps shown in FIGS. 5 and 8 in the manufacturing methods according to the first and second embodiments of the present invention.

Embodiments of the present invention will now be described, with reference to the accompanying drawings.

FIGS. 1 to 6 are cross-sectional views showing a method for manufacturing a semiconductor device according to the first embodiments of the present invention.

As shown in FIG. 1, a gate oxide film 2 having a thickness of about 100 Å is formed on the surface of a P-type silicon substrate 1 by thermal oxidation. A polysilicon layer is deposited on the surface of the gate oxide film 2 and etched using a photoetching method, with the result that a gate electrode 3 is formed on the gate oxide film 2.

As shown in FIG. 2, phosphorus is ion-implanted into the P-type silicon substrate 1 at a dose of $5\times10^{13}$ cm$^{-2}$, using the gate electrode 3 as a mask, to form N$^-$-type layers 11 and 12 of LDD regions in the P-type silicon substrate 1.

After that, as shown in FIG. 3, an insulation layer of Si$_3$N$_4$ having a thickness of about 1000 Å and a dielectric constant is deposited on the gate electrode 3 and the gate oxide film 2. The dielectric constant of the insulation layer is higher than that of the gate oxide film 2. Then, the insulation layer is etched anisotropically by RIE (Reactive Ion Etching) to form sidewall regions 13 of Si$_3$N$_4$ on both sides of the gate electrode 3.

As shown in FIG. 4, the gate oxide film 2 and the P-type silicon substrate 1 are etched anisotropically by the RIE by 0.1 μm, using the sidewall regions 13 and gate electrode 3 as masks.

After that, as shown in FIG. 5, arsenic is ion-implanted into the P-type silicon substrate 1 at a dose of $5\times10^{15}$ cm$^{-2}$, using the sidewall regions 13 and gate electrode 3 as masks, to form N$^+$-type layers 14 and 15 of source and drain regions therein.

Next, as shown in FIG. 6, for example, titanium is deposited on the gate electrode 3 and the N$^+$-type layers 14 and 15. Then, the P-type silicon substrate 1 is thermally treated to form a titanium silicide layer 18 on the gate electrode 3 and N$^+$-type layers 14 and 15.

According to the first embodiment, since the P-type silicon substrate 1 is etched downwardly at both the sidewall regions 13, a distance between the gate electrode 3 and each of the source and drain regions can be lengthened. For this reason, gate parasitic capacitances 16 and 17 between the gate electrode 3 and the source and drain regions can be decreased even though the N$^-$-type layers 11 and 12 of LDD regions can be reduced using a material having a high dielectric constant for the sidewall regions 13. Therefore, the driving performance of the LDD transistor can be improved and the power consumption thereof can be lowered.

Since the titanium silicide layer 18 is formed on the gate electrode 3 and the N$^+$-type layers 14 and 15, the parasitic resistances of the gate electrode 3 and N$^+$-type layers 14 and 15 can be reduced.

FIGS. 1 to 3 and 6 to 8 are cross-sectional views showing a method for manufacturing a semiconductor device according to the second embodiment of the present invention. The same structural elements as those of the first embodiment are denoted by the same reference numerals, and their descriptions are omitted.

As shown in FIG. 3, sidewall regions 13 of Si$_3$N$_4$ are formed on both sides of a gate electrode 3.

Figure 7:
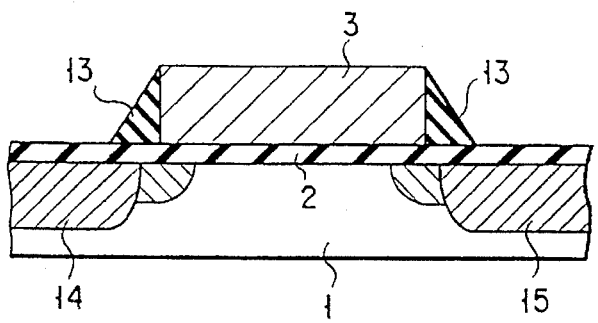
FIG. 7 is a cross-sectional view showing a step subsequent to the step shown in FIG. 3 in the manufacturing method according to the second embodiment of the present invention.

Next, as shown in FIG. 7, arsenic is ion-implanted into a P-type silicon substrate 1 at a dose of $5\times10^{15}$ cm$^{-2}$, using the sidewall regions 13 and gate electrode 3 as masks, to form N$^+$-type layers 14 and 15 of source and drain regions therein.

Figure 8:
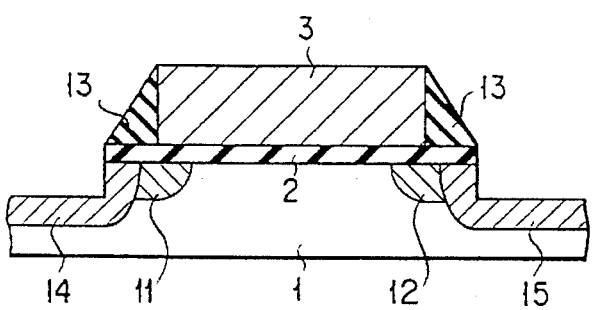
FIG. 8 is a cross-sectional view showing a step subsequent to the step shown in FIG. 7 in the manufacturing method according to the second embodiment of the present invention.

Thereafter, as shown in FIG. 8, the P-type silicon substrate 1 and gate oxide film 2 are anisotropically etched by the RIE by 0.1 μm, using the sidewall regions 13 and gate electrode 3 as masks.

Next, as shown in FIG. 6, a titanium silicide layer 18 is formed on the gate electrode 3 and N$^+$-type layers 14 and 15.

The same advantage as that of the first embodiment can be obtained from the second embodiment.

FIGS. 1 to 4, 9 and 10 are cross-sectional views showing a method for manufacturing a semiconductor device according to the third embodiment of the present invention. The same structural elements as those of the first embodiment are denoted by the same reference numerals, and their descriptions are omitted.

As shown in FIG. 3, first sidewall regions 13 of Si$_3$N$_4$ are formed on both sides of gate electrode 3.

After that, as shown in FIG. 4, a P-type silicon substrate 1 and a gate oxide film 2 are anisotropically etched by the RIE by 0.1 μm, using the first sidewall regions 13 and gate electrode 3 as masks. As a result, step portions 1a are formed in the P-type silicon substrate 1.

Figure 9:
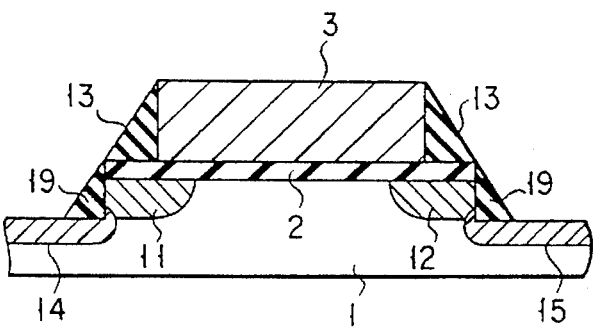
FIG. 9 is a cross-sectional view showing a step subsequent to the step shown in FIG. 4 in the manufacturing method according to the third embodiment of the present invention.

As shown in FIG. 9, an insulation layer of Si$_3$N$_4$ having a high dielectric constant is deposited on the P-type silicon substrate 1 and gate electrode 3, and then etched anisotropically by the RIE, with the result that second sidewall regions 19 of Si$_3$N$_4$ are formed on the step portions 1a. Then, arsenic is ion-implanted into the P-type silicon substrate 1 at a dose of $5\times10^{15}$ cm$^{-2}$, using the first and second sidewall regions 13 and 19 and gate electrode 3 as masks, to form N$^+$-type layers 14 and 15 of source and drain regions therein.

Figure 10:
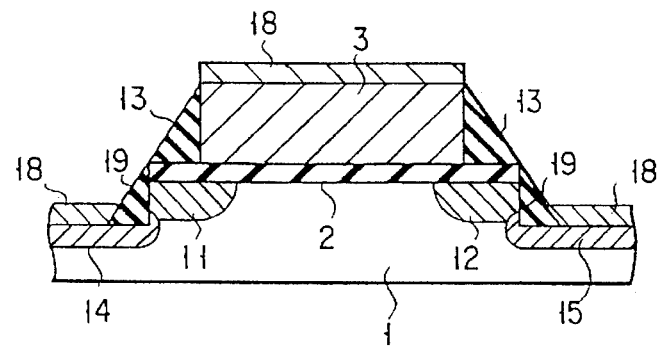
FIG. 10 is a cross-sectional view showing a step subsequent to the step shown in FIG. 9 in the manufacturing method according to the third embodiment of the present invention.

After that, as shown in FIG. 10, a titanium silicide layer 18 is formed on the gate electrode 3 and N$^+$-type layers 14 and 15. The second sidewall regions 13 and 19 include base portions on the surfaces of the N$^+$ layers 14 and 15 and upper portions extending from the base portions. The width of each of the second sidewall regions 13 and 19 is greater at the base portion than at the upper portion, and particularly the width of each the second sidewall region increases from the upper portions to the base portions.

The same advantage as that of the first embodiment can be obtained from the third embodiment. Since, moreover, the arsenic is ion-implanted into the P-type silicon substrate 1 using the first and second sidewall regions 13 and 19 and the gate electrode 3 as masks, a distance between the N$^+$-type layers 14 and 15 formed on the P-type silicon substrate 1 can be lengthened. Therefore, in the LDD transistor, a punch through phenomenon can be prevented from appearing.

More specifically, if the N$^+$-type layers 14 and 15 are formed deeply in the P-type silicon substrate 1, since the impurity concentrations of these layers in the deep position are low, a depletion layer is easy to extend on the substrate 1 when the transistor is operated, with the result that the punch through phenomenon easily appears. If, however, the distance between the N$^+$-type layers 14 and 15 is lengthened, no punch through phenomenon appears, though the depletion layer extends.

Furthermore, when the gate oxide film 2 and the P-type silicon substrate 1 are etched downward, the substrate 1 in an element isolation region (not shown) is also etched downward, with the result that an element isolation withstanding voltage may decrease. Since, however, the sidewall regions (not shown) are formed on the step portions (not shown) of the P-type silicon substrate 1, the element isolation withstanding voltage can be prevented from decreasing.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:
    a semiconductor substrate having a surface with a first surface portion at a first level and a second surface portion at a second level:
    an insulating layer formed only on said first surface portion of said semiconductor substrate;
    a gate electrode formed on an upper surface of said insulating layer;
    first sidewall spacers, each first sidewall spacer having a side portion contacting a sidewall of said gate electrode and a base portion contacting said upper surface of said insulating layer;
    source and drain regions formed in said second surface portion of said semiconductor substrate;
    first and second impurity regions formed in said first surface portion of said semiconductor substrate, said first impurity region being adjacent to said source region and having an impurity concentration lower than an impurity concentration of said source region, and said second impurity region being adjacent to said drain region and having an impurity concentration lower than an impurity concentration of said drain region; and
    second sidewall spacers, each second sidewall spacer having a side portion contacting a step portion between said first and second surface portions of said semiconductor substrate, a base portion contacting a corresponding one of said source and drain regions, and an upper portion extending from said base portion, wherein a width of each second sidewall spacer is greater at said base portion than at said upper portion.

2. A semiconductor device comprising:
    a semiconductor substrate having a surface with a first surface portion at a first level and a second surface portion at a second level;
    an insulating layer formed only on said first surface portion of said semiconductor substrate;
    a gate electrode formed on an upper surface of said insulating layer;
    first sidewall spacers, each first sidewall spacer having a side portion contacting a sidewall of said gate electrode and a base portion contacting said upper surface of said insulating layer;
    source and drain regions formed in said second surface portion of said semiconductor substrate;
    first and second impurity regions formed in said first surface portion of said semiconductor substrate, said first impurity region being adjacent to said source region and having an impurity concentration lower than an impurity concentration of said source region, and said second impurity region being adjacent to said drain region and having an impurity concentration lower than an impurity concentration of said drain region;
    second sidewall spacers, each second sidewall spacer having a side portion contacting a step portion between said first and second surface portions of said semiconductor substrate, a base portion contacting a corresponding one of said source and drain regions, and an upper portion extending from said base portion, wherein a width of each second sidewall spacer is greater at said base portion than at said upper portion; and
    a silicide layer formed on each of said source and drain regions and contacting each of said second sidewall spacers.

3. The semiconductor device according to claim 2, wherein the width of each of said second sidewall spacers increases from said upper portion to said base portion.

4. The semiconductor device according to claim 3, wherein the second sidewall spacers are formed of a material having a high dielectric constant.

5. A semiconductor device comprising:
    a semiconductor substrate;
    source and drain regions located in said semiconductor substrate, an upper surface of each of said source and drain regions being lower in level than a surface of said semiconductor substrate;
    a gate insulating layer located only on said surface of said semiconductor substrate between said source and drain regions;
    a gate electrode located above said gate insulating film;
    first and second corner portions each defined by said gate electrode and said gate insulating layer;
    first sidewall spacers located in said first and second corner portions, respectively, on opposite sides of said gate electrode;
    first and second impurity regions provided in the semiconductor substrate, said first impurity region being adjacent to said source region and having an impurity concentration lower than an impurity concentration of said source region, and said second impurity region being adjacent to said drain region and having an impurity concentration lower than an impurity concentration of said drain region;
    third and fourth corner portions, said third corner portion defined by said upper surface of said source region and a side surface of said first impurity region and said fourth corner portion defined by said upper surface of said drain region and a side surface of said second impurity region;
    second sidewall spacers located in said third and fourth corner portions, respectively, wherein said second sidewall spacers have base portions on said surfaces of said source and drain regions and upper portions extending from said base portions, wherein a width of each second sidewall spacer is greater at said base portion than at said upper portion; and
    a silicide layer formed on each of said source and drain regions and contacting each of said second sidewall spacers.

6. The semiconductor device according to claim 5, wherein a distance between said second sidewall spacers is greater than a distance between said first sidewall spacers.

7. The semiconductor device according to claim 6, wherein the width of each of said second sidewall spacers increases from said upper portion to said base portion.

8. The semiconductor device according to claim 7, wherein the second sidewall spacers are formed of a material having a high dielectric constant.

9. The semiconductor device according to claims 8, wherein the first sidewall spacers are formed of said material having a high dielectric constant.

* * * * *